(12) United States Patent
Bonar et al.

(10) Patent No.: US 11,275,202 B1
(45) Date of Patent: Mar. 15, 2022

(54) GRIN LENS STRUCTURE IN MICRO-LED DEVICES

(71) Applicant: Facebook Technologies, LLC, Menlo Park, CA (US)

(72) Inventors: James Ronald Bonar, Erskine (GB); James Small, Glasgow (GB); Gareth John Valentine, York (GB)

(73) Assignee: Facebook Technologies, LLC, Menlo Park, CA (US)

(*) Notice: Subject to any disclaimer, the term of this patent is extended or adjusted under 35 U.S.C. 154(b) by 698 days.

(21) Appl. No.: 15/824,972

(22) Filed: Nov. 28, 2017

(51) Int. Cl.
 *G02B 3/00* (2006.01)
 *H01L 21/265* (2006.01)
 *H01L 33/32* (2010.01)

(52) U.S. Cl.
 CPC ........ *G02B 3/0087* (2013.01); *H01L 21/2654* (2013.01); *H01L 33/32* (2013.01); *G02B 2003/0093* (2013.01)

(58) Field of Classification Search
 CPC .......... G02B 3/0087; G02B 2003/0093; H01L 21/2654; H01L 21/265; H01L 2251/50; H01L 2251/5307; H01L 33/16; H01L 33/00; H01L 33/32; H01L 31/162; H01L 31/143

USPC ............. 359/654; 362/23.07, 555, 800; 372/43.01, 49.01, 45.01

See application file for complete search history.

(56) References Cited

U.S. PATENT DOCUMENTS

| | | | | |
|---|---|---|---|---|
| 5,917,188 A | * | 6/1999 | Atkinson | G01N 21/3504 250/339.13 |
| 2003/0081642 A1 | * | 5/2003 | Hwang | H01S 5/18341 372/45.01 |
| 2010/0322551 A1 | * | 12/2010 | Budd | G02B 6/4206 385/14 |
| 2015/0155433 A1 | * | 6/2015 | Lo | H01L 33/10 257/94 |
| 2016/0104998 A1 | * | 4/2016 | Felder | H01S 5/18308 372/46.01 |
| 2017/0277065 A1 | * | 9/2017 | Kondo | H01L 33/105 |

\* cited by examiner

*Primary Examiner* — Travis S Fissel
(74) *Attorney, Agent, or Firm* — Fenwick & West LLP

(57) ABSTRACT

A GaN layer of micro-LEDs is exposed to ion implantation to amorphize one or more regions of the GaN layer. As a result, the GaN layer through which light rays propagate have non-uniform refractive indexes that modify propagation paths of some light rays. Ions are implanted in a region overlapping an active region that emits light to function as a converging GRIN (gradient-index) lens. The ion implanted regions collimate light rays that propagate along predetermined directions. As such, the light extraction from and the focus of the micro-LEDs is increased.

15 Claims, 4 Drawing Sheets

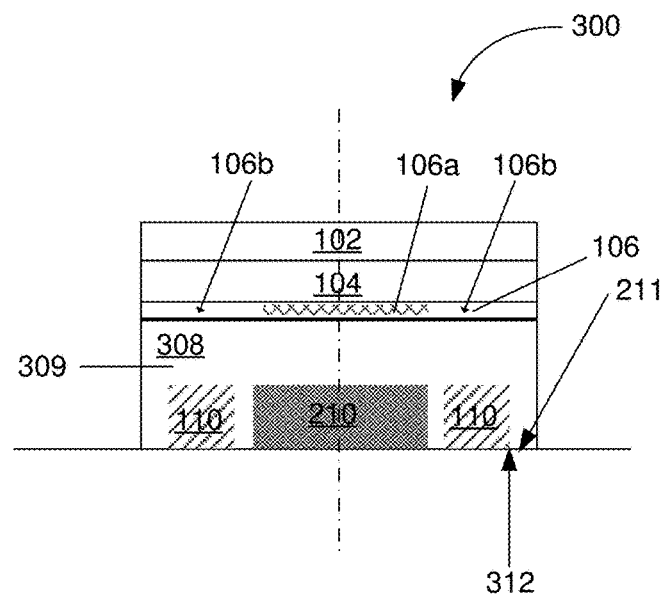
FIG. 3A
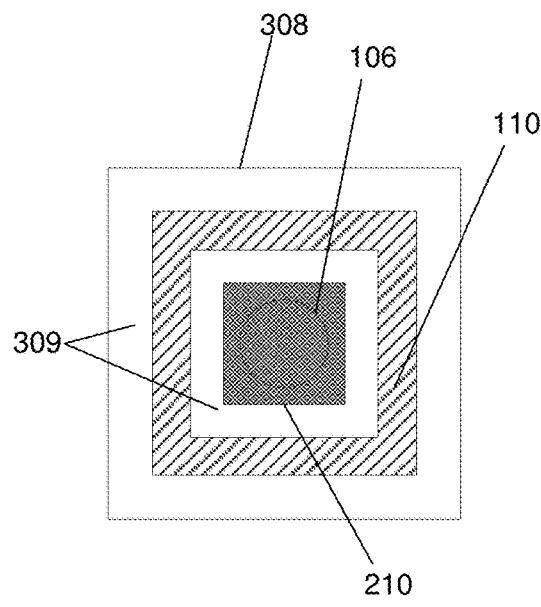 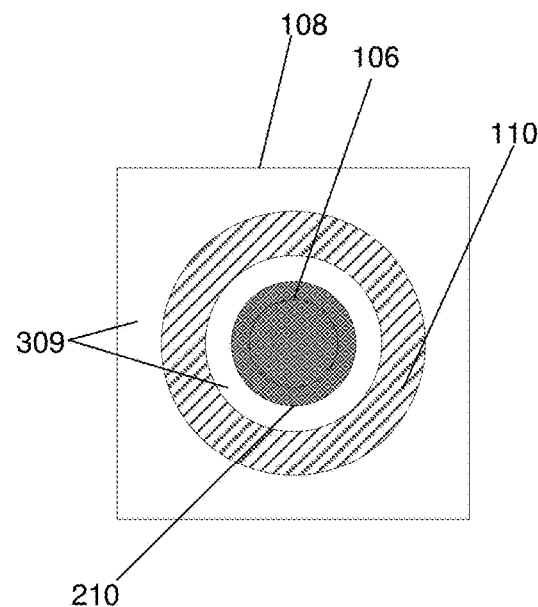
FIG. 3B        FIG. 3C

GRIN LENS STRUCTURE IN MICRO-LED DEVICES

CROSS-REFERENCE TO RELATED APPLICATION

This application is related to U.S. patent application Ser. No. 15/824,970 filed on Nov. 28, 2017.

BACKGROUND

The present disclosure generally relates to micro-LEDs (lighting emitting diodes), and specifically to exposing a GaN layer to ion implantation to increase light extraction from and the focus of the micro-LEDs.

BRIEF DESCRIPTION OF THE DRAWINGS

FIG. 3A is a cross-sectional view of an example micro-LED, according to one embodiment.

FIGS. 3B and 3C are top views of example micro-LEDs, according to different embodiments.

The figures depict embodiments of the present disclosure for purposes of illustration only.

DETAILED DESCRIPTION

The light extraction efficiency of micro-LEDs may be limited by total internal reflection caused by the difference between the refractive index of crystalline GaN materials and that of the output materials (e.g., air, sapphire, silicon carbide). Conventional approaches physically etch structures that redirect light rays generated at angles larger than the escape cone into a shallower angle to increase the light extraction from micro-LEDs. The physically etched structures allow the rays to exit from the substrate whilst increasing the effective size of the micro-LEDs (mLEDs). However, an increase in the non-radiative recombination on the etched surface may result in a reduction in the intrinsic quantum efficiency of the LED.

In addition, it is advantageous to form a tightly focused spot and have a suitable depth of field at the same time for pattern programmable light sources. One of many approaches to achieve this is to use shaped etched pixels that "funnel" the emitted light into a well-defined beam. However, this approach has its disadvantages. First, it is challenging to determine high resolution features to be transferred into the GaN materials and unwanted recombination effects at the sidewalls of the mLEDs. Secondly, to provide a well-defined beam, this approach uses LED materials that include thick layers of compound semiconductor material, which is not applicable to readily available commercial GaN LED wafers.

Embodiments related to exposing a GaN layer of mLEDs to ion implantation thereby to amorphize one or more regions of the GaN layer. As a result, the GaN layer through which light rays propagate have non-uniform refractive indexes that modify propagation paths of some light rays. The GaN layer is exposed to ion implantation such that one or more regions of the GaN layer are amorphized for performing different optical functions. In one embodiment, a region that overlaps an active region that emits light is exposed to ion implantation. This region functions as a converging GRIN (gradient-index) lens. The amorphous regions collimate light rays that propagate along predetermined directions thereby to increase the light extraction from and/or the focus of the micro-LEDs. In one implementation, exposure to oxygen ion implantation is carried out with implantation energies such that the oxygen ions are deposited in the local converted regions. This oxygen ion implantation converts the crystalline GaN into an amorphous-GaN:O form by disrupting the crystal lattice. The oxygen ion implantation also serves to stabilize this amorphous form from a self-annealing effect during the implantation exposure.

Figure 1A:
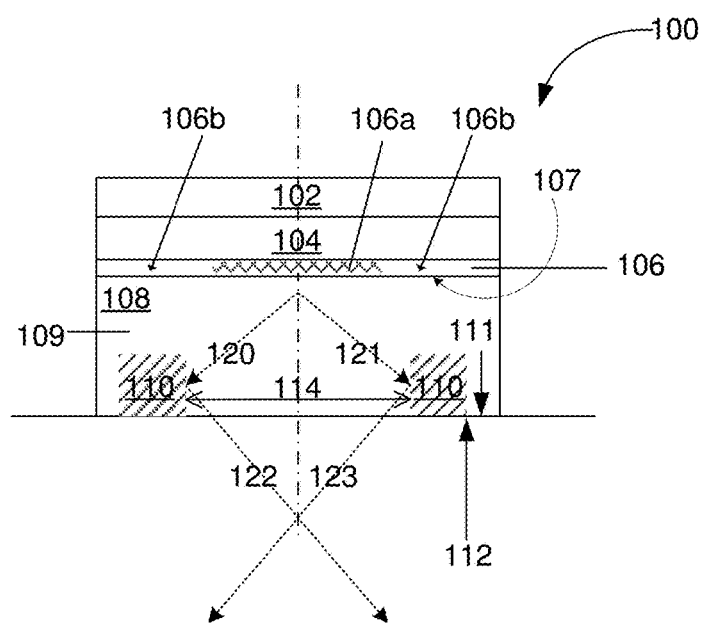
FIG. 1A is a cross-sectional view of an example micro-LED, according to one embodiment.

FIG. 1A is a cross-sectional view of an example micro-LED 100, according to one embodiment. The example micro-LED ("mLED") 100 is made of a semiconductor material and includes a p-n junction. The example mLED 100 comprises a multi-layer epitaxial thin film structure as further described below in connection with FIGS. 4A through 4C and is deposited onto a substrate (not shown). The substrate can be made of any suitable material, such as sapphire, silicon carbide, gallium nitride, silicon, or any other substrate material demonstrated in the art for growth of epitaxial structures. To facilitate discussion, a bottom of the mLED is defined as the surface that contacts the substrate onto which the mLED 100 is deposited.

From top to bottom, the example mLED 100 includes a metal contact 102 that is deposited on a p-type GaN layer 104 to allow electrical stimulation of the mLED 100. The metal contact 102 may be made of aluminum, silver, or other conductive materials. The metal contact 102 may function as a reflective layer that reflects some light generated by a quantum well layer 106 towards the bottom of the mLED. The p-type GaN layer 104 is used as a p-type contact. The p-type GaN layer 104 may be doped with magnesium (Mg) and may have a thickness in the range of 0.05 to 0.5 micron.

The p-type GaN layer 104 is on a quantum well layer 106. The quantum well layer 106 may include a confined active region 106a and one or more non-active regions 106b. The confined active region 106a is the active region between the two types of semiconductor materials (i.e., the p-type GaN 104 and the n-type GaN 108) that emits light (e.g., violet light, blue light, green light, red light) in response to a potential difference applied between the n-type GaN layer 102 and the p-type GaN layer 104. The electroluminescent wavelength of the light emitted is determined by a width and composition of the quantum well. For example, a 2 nm-thick In(0.2)Ga(0.8)N quantum well emits luminescence near 450 nm. In some embodiments, the quantum well layer 106 is an InGaN/GaN (Indium gallium nitride/gallium nitride) quantum well. The quantum well layer 106 can be a single-quantum well structure or a multi-quantum well structure. The confined active region 106a corresponds to a pixel. The non-active regions 106b do not emit light as the current is channeled into the confined active region.

The quantum well layer 106 is deposited on the n-type GaN layer 108 which is used as an n-type contact. The metal contact deposited on the n-type GaN layer 108 is not shown. In the illustrated example, the quantum well layer 106 is grown on the n-type GaN layer 108. The n-type GaN layer 108 has an interior surface 111 and an exterior surface 112 opposite the interior surface 111. The exterior surface 112 contacts a substrate (not shown) that supports the mLED 100. Multiple mLEDs can share one p-type GaN layer 104 (or n-type GaN layer 108). That is, the p-type GaN layer 104 (or n-type GaN layer 108) can extend across multiple mLEDs. In this way, the multiple mLEDs can be electrically stimulated simultaneously. For example, when mLEDs are arranged to form a display, the mLEDs share a common n-type GaN layer 108 but have isolated p-type GaN layers. The mLEDs 100 can be independently controlled by applying different voltage to their respective p-type GaN layer.

One or more regions of the n-type GaN layer 108 are exposed to ion implantation and thus may include implanted ions. The rest of the n-type GaN layer 108 is not or is substantially not exposed to ion implantation. The exposure to ion implantation amorphize the n-type GaN that is originally crystalline and changes the refractive index of the material. The one or more regions of the n-type GaN layer 108 can be partially or completely amorphous. An n-type GaN exposed to ion implantation has a significantly lower refractive index (e.g., 2.2) than an n-type GaN without being exposed to ion implantation. Accordingly, the refractive index is not uniform across the n-type GaN layer 108 and changes propagation of incoming light emitted by the quantum well layer 106 through the n-type GaN layer 108. As further described below, ion implantation is performed in a variety ways to increase light extraction efficiency of the n-type GaN layer 108 and/or to increase focus of outgoing light exiting the n-type GaN layer 108.

During implantation, the ions can be of different energy levels such that the energy collision cascades damage or destroy the crystal structure. In some cases, the implantation energy levels are configured with sufficient spread such that the implantation occurs within the volume of the material (e.g., GaN). In some cases, the implantation energy levels and the spread are configured such that the ions are stopped within a localized region of the material. The localized region is separate and away from the volume undergoing the amorphous conversion. The ions (e.g., oxygen ions) may serve to stabilize the amorphous material.

In some embodiments, one or more regions of the n-type GaN layer 108 that are exposed to ion implantation form an optical waveguide that guides light rays to propagate along predetermined directions through the n-type GaN layer 108. That is, the amorphous regions 110 deflect light rays from propagating along predetermined directions or significantly reduce light rays that propagate along the predetermined directions within the n-type GaN layer 108. The regions that are exposed to ion implantation may include implantation of ions. A region that is exposed to ion implantation is also referred hereinafter as "an amorphous region" and a region that is not exposed to ion implantation is also referred hereinafter as "a crystalline region." An amorphous region can be partially or completely amorphous. An amorphous region is positioned along predetermined propagation paths of incoming light rays emitted by the quantum well layer 106.

Because the amorphous region has a different refractive index than the crystalline GaN region, the amorphous region modifies the propagation paths of these light rays, thereby modifying the angle of incidence of these light rays with respect to the interior surface 111. As described herein, an angle of incidence is the angle between a light ray incident on a surface (e.g., the interior surface 111) and the normal direction that is perpendicular to the surface at the point of incidence. The amorphous regions are positioned such that reflection of light rays internally within the n-type GaN layer 108 is reduced and a light extraction efficiency of the n-type GaN layer 108 is increased. The refractive index of the amorphous region is lower than that of the crystalline region. In some embodiments, the amorphous region 110 has a uniform refractive index profile. In some embodiments, the amorphous region 110 has a graded refractive index profile. A refractive index of the amorphous region 110 is in the range of 2.1 to 2.45. A refractive index of the crystalline region is in the range of 2.38 to 2.56.

In the illustrated example, the amorphous region 110 is tube-shaped. The amorphous region 110 partially encloses a crystalline GaN region 114 through which light rays can propagate. The n-type GaN layer 108 further includes a crystalline GaN region 109 that is not partially enclosed by the amorphous region 110. The amorphous region 110 guides incoming light rays that propagate along predetermined directions (e.g., 120, 121) to propagate through the crystalline GaN region 114 in a direction towards the bottom of the mLED 100. Because the refractive index of the amorphous region 110 is lower than that of the crystalline GaN region 114, the amorphous region 110 deflects incoming light rays from the crystalline GaN region 114 when the light rays are incident on a surface of the amorphous region 110. As such, the angle of incidence of these light rays on the interior surface 111 of the n-type GaN layer 108 are changed. The crystalline GaN region 114 has a refractive index in the range of 2.38 to 2.56.

In the illustrated example, the amorphous region 110 has a uniform refractive index profile, the amorphous region 110 reflects the incoming light rays. The light rays propagate through the crystalline region 114, for example, along directions 122, 123. In other embodiments where the amorphous region 110 has a non-uniform (e.g., graded) refractive index profile, the light rays follow a non-linear path when propagating within the crystalline GaN region 114 towards the bottom of the mLED 100. The refractive index of the amorphous region 110 varies along a first direction that is substantially parallel to the interior surface 111 and is substantially uniform along a second direction that is perpendicular to the interior surface 111. For example, if the amorphous region 110 has a substantially parabolic refractive index profile, the light rays follow one or more sinusoidal paths. That is, the refractive index of the amorphous region 110 changes as a parabolic function of the radius distance from the center of the mLED 100.

The amorphous region 110 may be of different depths. For example, as illustrated, the amorphous region 110 are shallower than the n-GaN layer 108 in depth. During implantation, the ions do not reach the quantum well layer 106. In other embodiments, the amorphous region 110 is as deep as the n-GaN layer 108. In some embodiments, for example as illustrated, the interior surface of the amorphous region 110 is substantially perpendicular to an exterior surface 107 of the quantum well region 106. In other embodiments, the amorphous region 110 is conically-shaped.

Figure 1B:
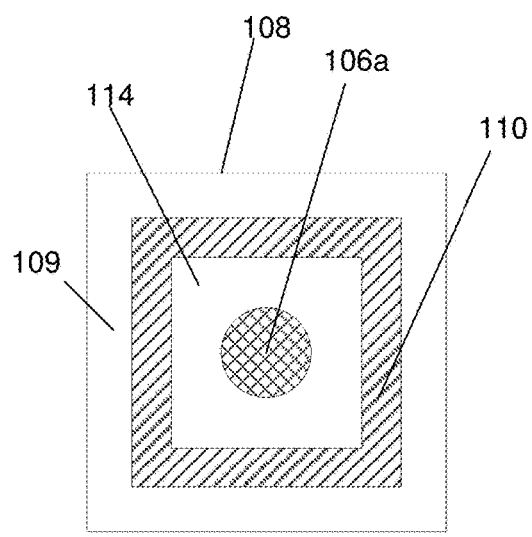
FIGS. 1B and 1C are top views of example micro-LEDs, according to different embodiments.
Figure 1C:
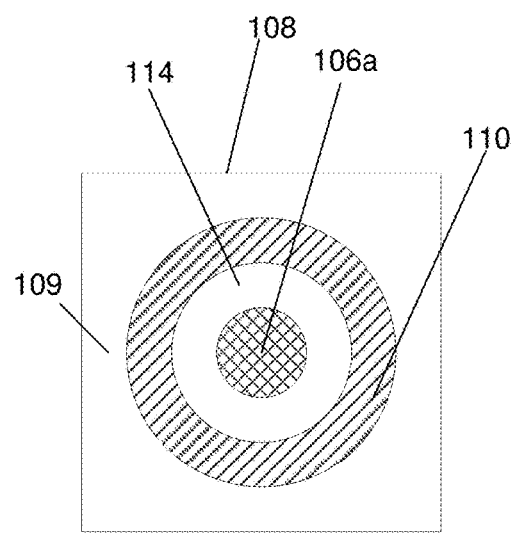

In some embodiments, for an individual mLED, the amorphous region 110 is positioned offset from the confined active region 106a such that the crystalline region 114 overlaps the confined active region 106a. The amorphous region 110 does not overlap the confined active region 106a. The crystalline region 114 preferably overlaps the entire confined active region 106a such that substantially all light emitted by the confined active region 106a is directed into the crystalline region 114. The amorphous region 110 has a cross-section that is substantially cylindrical, square, rectangular, hexagonal or other shapes. For example, as illustrated in FIG. 1B, a cross-section of the amorphous region 110 is substantially square shaped. A cross-section of the amorphous region 110 is substantially cylindrical shaped in the example illustrated in FIG. 1C. In both examples, the centers of the quantum well layer 106, the amorphous region 110, and the crystalline region 114 are aligned. The crystalline region 114 may overlap the entire confined active region 106a.

The example structure illustrated in FIG. 1A can include other additional layers. For example, a capping layer is between the metal contact 102 and the p-type GaN layer 104. The capping layer is grown over the p-type GaN layer 104 and the metal contact 102 is formed on the capping layer. The capping layer may be made of highly doped p++ GaN, indium tin oxide (ITO), or other transparent conductors. As another example, an electron blocking layer (EBL) such as an aluminum gallium nitride (AlGaN) is between the quantum well layer 106 and the p-type GaN layer 104. The EBL is grown on the quantum well layer 106 to improve the performance of the quantum well layer 106 (e.g., the confined active region). These additional layers may or may not be included in the epitaxial design.

Figure 2A:
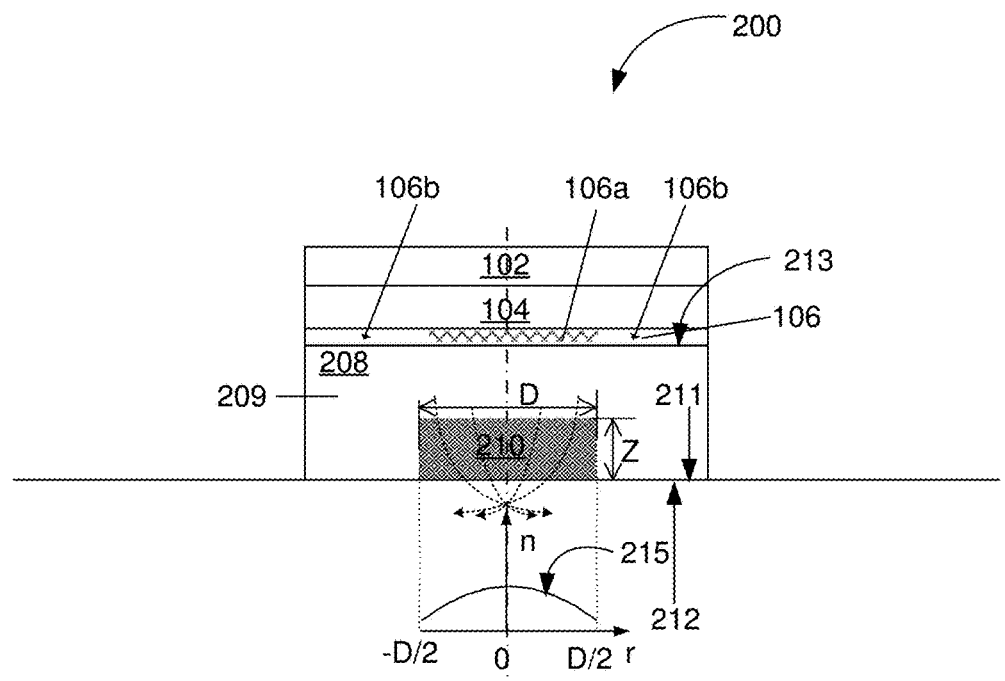
FIG. 2A is a cross-sectional view of an example micro-LED, according to one embodiment.

In some embodiments, an amorphous region collimates light rays that propagate through an n-type GaN layer. FIG. 2A is a cross-sectional view of an example mLED that includes amorphous regions that collimates light rays. The example mLED 200 includes a metal contact 102, a p-type GaN layer 104, a quantum well layer 106, and an n-type GaN layer 208. Compared to the mLED 100 illustrated in FIG. 1A, the mLED 200 includes a different n-type GaN layer 208 than the n-type GaN layer 108. The description of the metal contact 102, p-type GaN layer 104, and quantum well layer 106 can be found with respect to FIG. 1A and is omitted herein with respect to FIG. 2A.

The n-type GaN layer 208 is used an n-type contact. The metal contact deposited on the n-type GaN layer 208 is not shown. The n-type GaN layer 208 includes an amorphous region 210 and a crystalline region 209. The amorphous region 210 may include varying doses of ion implantation along a plane that is parallel to the interior surface 211 of the n-type GaN layer 208. Because the interior surface 211 of the n-type GaN layer 208 is typically parallel or substantially parallel to the interior surface 213 of the quantum well layer 106, the doses of ion implantation vary along a plane that is parallel to the interior surface 213 of the quantum well layer 106. In some embodiments, the doses of ion implantation increase radially from the center to the perimeter of the amorphous region 210. Accordingly, a refraction index decreases from the center to the perimeter of the amorphous region 210 radially. By having a varying refraction index from the center to the perimeter, the amorphous region 210 collimates incoming light rays emitted by the quantum well layer 106. That is, the amorphous region 210 functions as a converging gradient-index (GRIN) lens. By collimating incoming light rays emitted by the quantum well layer 106, the amorphous region 210 increases the light extraction efficiency of a mLED 200.

In some embodiments, the refraction index of the amorphous region 210 follows a parabola (e.g., the parabola 215) such that its refraction index varies parabolicly from the center to the perimeter of the amorphous region 210 radially. The refraction index can be determined according to Equation (1):

$$n(r) = n_1 \left(1 - \frac{(r\sqrt{A})^2}{2}\right), \quad (1)$$

where n(r) is the index at a location that is of a distance r from the center of the amorphous region 210, $n_1$ is a refraction index of the amorphous region 210 at the center, r is the radial distance from the center to the perimeter of the amorphous region 210, and $\sqrt{A}$ is the gradient constant describing the index variation across the amorphous region 210. A refractive index of the amorphous region 210 is in the range of 2.1 to 2.55.

The dimension (e.g., a width, a length) of the amorphous region 210 can be determined based on a light extraction efficiency of the mLED 200 and a beam divergence of light emitted by the mLED 200. The dimension is chosen to maximize the light extraction efficiency and to minimize the divergence of the light. The depth Z and the diameter D of the amorphous region 210 can be determined according to Equations (2) and (3), respectively:

$$Z = \frac{2\pi P}{\sqrt{A}}, \quad (2)$$

where P is the pitch of the corresponding GRIN lens that refers to the fraction of a complete sine wave cycle a ray would complete on propagating through the lens, and $\sqrt{A}$ is the gradient constant describing the index variation across the amorphous region 210. For example, a pitch P of 0.25 indicates a quarter of a complete cycle.

$$D = \frac{\sqrt[z]{32\left(1 - \frac{n2}{n1}\right)}}{\pi}, \quad (3)$$

where $n_2$ is a refraction index of the amorphous region 210 at the perimeter (i.e., r=D/2). In various embodiments, $n_1$ and $n_2$ have values of 2.45 and 2.2, respectively.

In one embodiment, the amorphous region 210 has a diameter of 2.6 micrometers and a depth of 4 micrometers used for collimating light rays having wavelength of 460 nanometers. The light rays are emitted from the confined active region 106a of which a diameter is less than 2.6 micrometers.

Figure 2B:
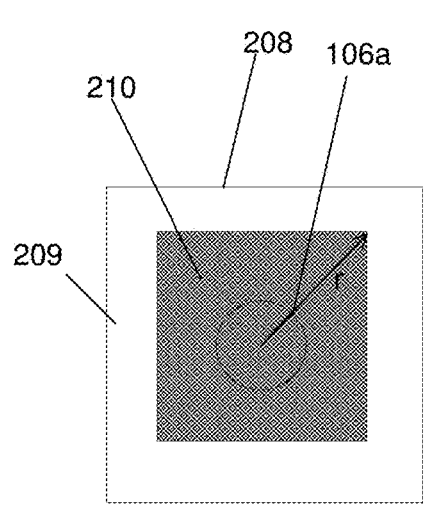
FIGS. 2B and 2C are top views of example micro-LEDs, according to different embodiments.
Figure 2C:
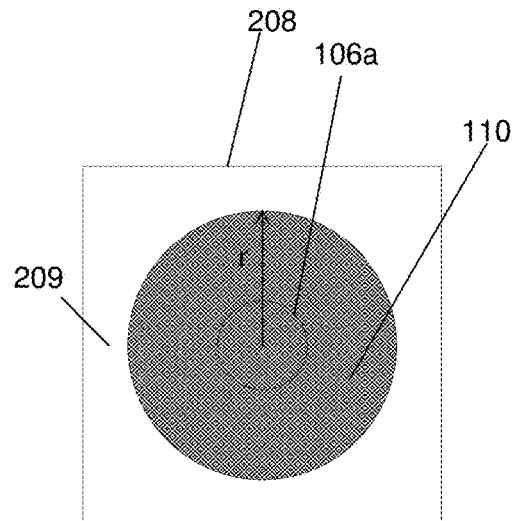

The amorphous region 210 is column shaped and has a cross-section that is substantially cylindrical, square, rectangular, or other shaped. In some embodiments, the amorphous region 210 is positioned such that its center is aligned with the center of the confined active region 106a and the amorphous region 210 overlaps the confined active region 106a, as further illustrated in FIGS. 2B and 2C. For example, as further illustrated in FIG. 2B, a cross-section of the amorphous region 210 is square shaped. A cross-section of the amorphous region 210 is substantially circular shaped in the example illustrated in FIG. 1C. The ion-implantation dose varies radially from the center to the perimeter of the amorphous region 210 as illustrated. The amorphous region 210 preferably has a larger cross-section than the confined active region 106a.

Some embodiments include both types of amorphous regions as described with respect to FIGS. 1A through 2C for collimating light rays and for increasing the light extraction efficiency. An example is described with respect to FIG. 3A through 3C.

FIG. 3A is a cross-sectional view of an example mLED 300. The mLED 300 includes a metal contact 102, a p-type GaN layer 104, a quantum well layer 106, and an n-type GaN layer 308. Compared to the mLEDs 100, 200 illustrated in FIGS. 1A and 2A, the mLED 300 includes a different n-type GaN layer 308 than the n-type GaN layers 108, 208. The description of the metal contact 102, p-type GaN layer 104, and quantum well layer 106 can be found with respect to FIG. 1A and is omitted herein with respect to FIG. 3A.

A metal contact (not shown) is deposited on the n-type GaN layer 308 is used as an n-type contact. The n-type GaN layer 308 includes a first amorphous region 210, a second amorphous region 110, and a crystalline region 309. The first and second amorphous regions 210, 110 are described with respect to FIGS. 2 and 1A through 1C, respectively. The first and second amorphous regions 210, 110 are positioned such that the first amorphous region 210 overlaps the confined active region 106a and the second amorphous region 110 does not overlap the confined active region 106a. The cross-sections of the first and second amorphous regions 110, 210 are preferably the same. For example, both amorphous regions have rectangular-shaped cross sections as illustrated in FIG. 3B, and both amorphous regions have circular-shaped cross sections as illustrated in FIG. 3C. As illustrated, the first amorphous region 210 and the second amorphous region 110 are not contiguous, and a crystalline region 309 is positioned between the amorphous regions 210, 110. However, the first amorphous region 210 and the second amorphous regions 110 can be contiguous. Other embodiments of mLEDs can be based on other multi-layer epitaxial thin film structures that are different from the examples illustrated in FIGS. 1A through 3C.

Figure 4A:
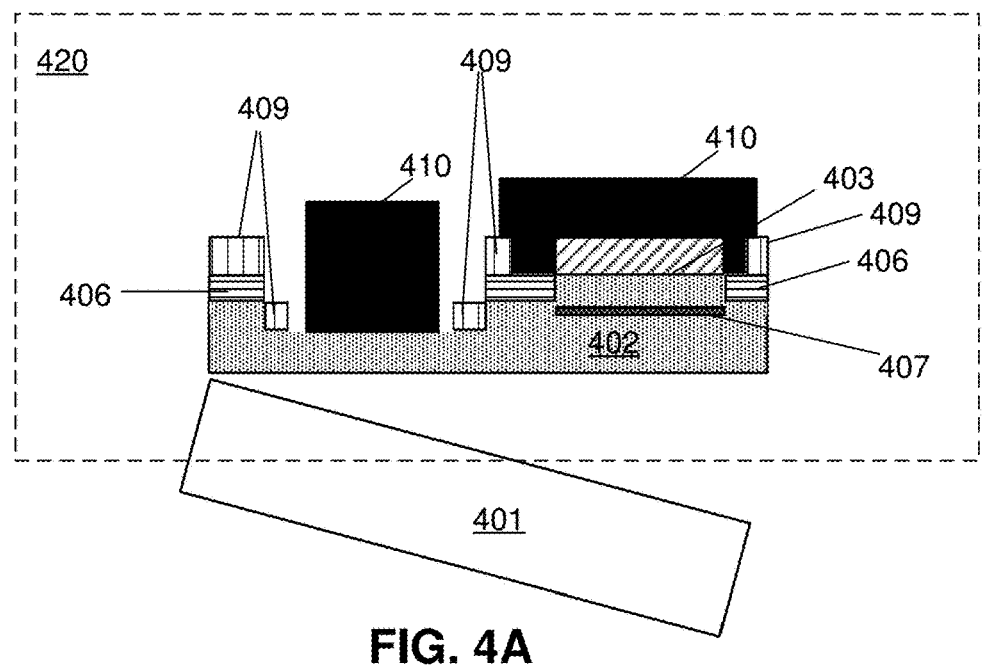
FIGS. 4A through 4C illustrate an example process of manufacturing an example micro-LED by exposing a GaN layer to ion implantation, according to one embodiment.
Figure 4B:
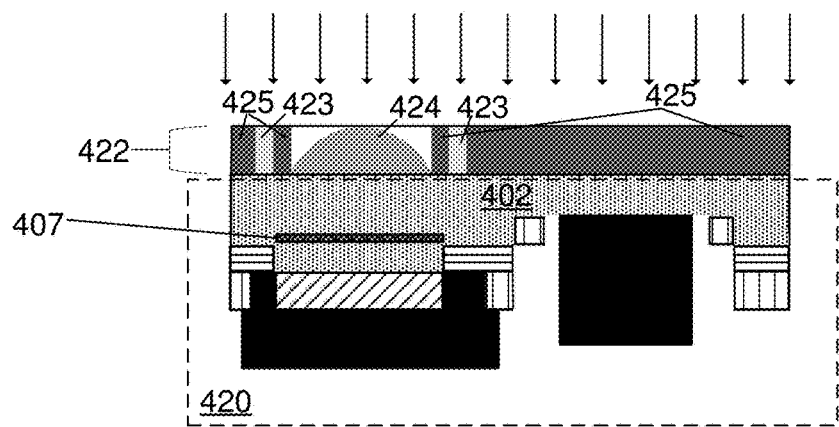
Figure 4C:
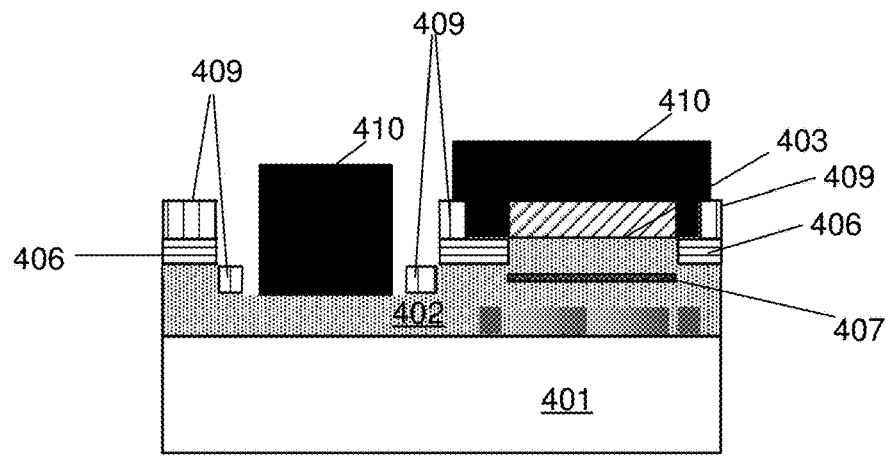

FIGS. 4A through 4C illustrate an example process of manufacturing an example mLED by exposing a GaN layer to ion implantation, according to one embodiment. The example mLED manufactured according to the example process is based on a different structure from that of the example mLEDs 100, 200, and 300 described above.

After LED epitaxial layers have been grown on the substrate 401, the substrate 401 is removed. The substrate 401 can be removed, for example, by laser lift-off or by grinding and wet or plasma etching. After the substrate 401 is removed, the n-type GaN layer 402 is exposed to ion implantation. A mask 422 is placed onto the n-type GaN layer 402. The mask 422 is patterned such that it includes one or more regions that allow ions to reach the n-type GaN layer 402. For example, the mask 422 includes a grid of regions that allow ions to pass. The regions are positioned the same as mLEDs positioned. That is, two consecutive masks are separated by a same distance that separates two consecutive LEDs. When placing the mask 422 onto the n-GaN layer 402, the regions are aligned to individual mLEDs.

As illustrated, the mask 422 includes regions 423, 424, and 425. The regions 423 and 424 allow ions to reach the n-type GaN layer 402 to form one or more amorphous regions (e.g., the amorphous regions 110, 210). The region 423 has a substantially uniform thickness and the region 424 has a non-uniform thickness. As illustrated, the region 424 has a sloped wall. The thickness of the region 424 decreases from its center to the perimeter and thus an ion-blockage rate decreases from its center to the perimeter. That is, the center region allows less ions to pass compared to the perimeter region. Accordingly, across the corresponding masked area, the center is more crystalline than the perimeter after ion implantation. A thickness of the region 424 may follow a parabolic curve such that doses of ion implantations in the corresponding masked area change according to a parabolic curve as described with respect to FIG. 2A. The region 423 allows higher doses of ions to reach the n-type GaN layer 402 compared to the region 424. Accordingly, masked areas corresponding to the region 423 are more amorphous than the masked areas corresponding to the region 424 and thus have a lower refractive index. The masked areas corresponding to the region 424 is amorphous of a varying degree because the region 424 has a varying degree of thickness. Further, the region 425 blocks ions from reaching the n-type GaN layer 402. In other embodiments, a mask includes one or more of the regions 423, 424, and 425.

The mask 422 is positioned such that an individual region 424 overlaps a quantum well of an individual LED architecture and an individual region 423 does not overlap the quantum well. As illustrated, the mask includes a region 425 that blocks ions between the region 424 and the region 423. The regions 424, 423 can be contiguous. In some embodiments, the mask includes only the region 424 or only the region 423. That is, the region 424 is replaced with the region 425 or the region 423 is replaced with the region 425.

In various embodiments, the region 423 has a ring-shaped cross section in circular, rectangular, square, or other shapes. The region 424 has a cross section that is circular, rectangular, square, or other shaped. The cross section of the region 424 varies in area across a depth of the mask. The cross section of the region 424 that contacts the exterior surface of the n-GaN layer 402 is preferably at least the same or larger than the active light emitting region (e.g., the confined active region 106a). When placing the mask 424 onto the exterior surface of the n-GaN layer 402, a center of the region 424 is aligned to a center of the active region. When the mask 422 does not include any region 424, the region 423 partially encloses an ion block region 425. A center of the region 423 and the center(s) of the one or more region(s) that are partially enclosed by the region 423 are aligned. For example, as illustrated, a center of the region 423 is aligned to a center of the region 424, both of which are aligned to the center of the active region when the mask 422 is placed onto the n-type GaN 402.

In the illustrated example, doses of implanted ions are regulated by controlling a thickness of regions of the mask 422 that allow ions to pass. Other properties of the mask 422 can be regulated to control doses of ions implanted into n-GaN layers. In some cases, the n-GaN region 402 may be pre-coated with specific materials such as silicon nitride to tailor the ion implantation characteristics. The ion species, dose, and/or implantation energy are selected according to a desired refractive index range of the amorphous form of the n-GaN region 402. The ion species may be selected to have specific properties that are of importance within the n-GaN region after implantation is complete such as using oxygen ions for amorphous material stabilization. In some cases, the ions may be projected at angles to tailor specific requirements. In some cases, the ion species, energy, projection angle, and the coating may be selected to tailor the straggle of the ion implantation such that a conical shaped volume of the n-GaN region 402 becomes amorphous.

After the mask is applied, ion implantation is performed in a direction such that ions are accelerated and impacted into the n-type GaN layer 402 through the mask 422. As such, one or more amorphous regions are formed. The mask 422 and any pre-treatment GaN coating may be subsequently removed and the substrate is assembled back to the LED architecture of which the n-type GaN layer 402 includes one or more amorphous regions.

Other arrangements and structures can also be used. For example, in various embodiments described herein, the lower contact is an n-type material and the upper contact is a p-type material. A reverse structure can also be used such that the lower contact is a p-type material and the upper contact is an n-type material.

The foregoing description of the embodiments has been presented for the purpose of illustration; it is not intended to be exhaustive or to limit the patent rights to the precise forms disclosed.

The language used in the specification has been principally selected for readability and instructional purposes, and it may not have been selected to delineate or circumscribe the inventive subject matter. It is therefore intended that the scope of the patent rights be limited not by this detailed description, but rather by any claims that issue on an application based hereon. Accordingly, the disclosure of the embodiments is intended to be illustrative, but not limiting, of the scope of the patent rights, which is set forth in the following claims.

What is claimed is:

1. A light emitting diode, comprising:
   a first layer of semiconductor material;
   an active region on the first layer of semiconductor material; and
   a second layer of semiconductor material on the active region, the active region configured to emit light through the second layer of semiconductor material in response to a potential difference applied between the first layer and the second layer of semiconductor material;
   wherein the second layer of semiconductor material comprises a first region positioned to overlap the active region, wherein the first region has a refractive index profile that changes gradually in a radial direction from a center of the first region.

2. The light emitting diode of claim 1, wherein doses of implanted ions in the first region of the second layer of semiconductor material vary radially from a center of the first region to a perimeter of the first region.

3. The light emitting diode of claim 1, wherein doses of implanted ions in the first region of the second layer of semiconductor material increase from a center of the first region to a perimeter of the first region.

4. The light emitting diode of claim 3, wherein a profile of the doses is represented as a parabolic curve that decreases from the center of the second layer of semiconductor material towards a perimeter of the second layer of semiconductor material.

5. The light emitting diode of claim 1, wherein doses of implanted ions in the first region of the second layer of semiconductor material are selected such that the first region collimates at least part of the light passing through the first region.

6. The light emitting diode of claim 1, wherein the first region is column-shaped.

7. The light emitting diode of claim 1, wherein the first region has a cross-section that is circular shaped.

8. The light emitting diode of claim 1, wherein the first region has a cross-section that is rectangular shaped.

9. The light emitting diode of claim 1, wherein the first region is configured to alter a light path of the light.

10. The light emitting diode of claim 1, wherein the first region is configured to perform at least one of focusing the light and increasing a light extraction efficiency of the light emitting diode.

11. The light emitting diode of claim 1, wherein the second layer of semiconductor material comprises a second region partially enclosing the first region and including implanted ions.

12. The light emitting diode of claim 11, wherein a dose of implanted ions in the second region is at least the same as a dose of implanted ions in the first region.

13. The light emitting diode of claim 11, wherein the first region and the second region are contiguous.

14. The light emitting diode of claim 1, wherein the first region has a refractive index in the range of 2.1 to 2.55.

15. The light emitting diode of claim 1, wherein the light emitting diode is based on a multi-layer epitaxial thin film structure.

* * * * *